(12) United States Patent
Nortrup

(10) Patent No.: US 7,345,700 B2
(45) Date of Patent: Mar. 18, 2008

(54) ON SCREEN DISPLAY AS DIAGNOSTIC AID

(75) Inventor: Kevin Eugene Nortrup, Fairland, IN (US)

(73) Assignee: Thomson Licensing, Boulogne, Billancourt (FR)

( * ) Notice: Subject to any disclaimer, the term of this patent is extended or adjusted under 35 U.S.C. 154(b) by 42 days.

(21) Appl. No.: 10/451,967

(22) PCT Filed: Dec. 3, 2001

(86) PCT No.: PCT/US01/46536

§ 371 (c)(1),
(2), (4) Date: Jun. 27, 2003

(87) PCT Pub. No.: WO02/37579

PCT Pub. Date: May 10, 2002

(65) Prior Publication Data

US 2004/0051108 A1    Mar. 18, 2004

Related U.S. Application Data

(60) Provisional application No. 60/258,854, filed on Dec. 28, 2000.

(51) Int. Cl.
*H04N 7/00* (2006.01)

(52) U.S. Cl. .................................................. 348/180
(58) Field of Classification Search ................ 348/478, 348/473, 476, 467, 461, 468, 589, 584, 563–569
See application file for complete search history.

(56) References Cited

U.S. PATENT DOCUMENTS

| | | | |
|---|---|---|---|
| 3,866,210 A | | 2/1975 | Lokerson et al. ............ 340/324 |
| 5,396,297 A | * | 3/1995 | Shindou et al. ............. 348/569 |
| 5,541,663 A | * | 7/1996 | Ohno ........................... 348/478 |
| 5,815,211 A | * | 9/1998 | Umei ........................... 348/478 |
| 6,236,392 B1 | * | 5/2001 | Inamori ....................... 345/204 |
| 6,295,093 B1 | * | 9/2001 | Park et al. ................... 348/473 |
| 6,344,856 B1 | * | 2/2002 | Lum et al. ................... 345/562 |
| 6,377,894 B1 | * | 4/2002 | Deweese et al. ............. 702/22 |
| 6,421,793 B1 | * | 7/2002 | Lester et al. ................. 714/37 |

OTHER PUBLICATIONS

International Search Report.

* cited by examiner

*Primary Examiner*—Paulos M. Natnael
(74) *Attorney, Agent, or Firm*—Joseph J. Laks; Robert D. Shedd; William A. Lagoni

(57) ABSTRACT

A method for displaying data within a video display having on screen message display capability. The method comprises the steps of accessing digital data within the display, and displaying each bit of data as a character forming part of an on screen message display representation of the digital data.

16 Claims, 2 Drawing Sheets

ON SCREEN DISPLAY AS DIAGNOSTIC AID

This application claims the benefit under 35 U.S.C. § 365 of International Application PCT/US01/46536 filed Dec. 3, 2001, which claims the benefit of U.S. Provisional Application No. 60/258,854 filed Dec. 28, 2000.

This invention relates to the field of video image display and in particular to use of an on screen message display capability as a diagnostic aid.

BACKGROUND OF THE DISCLOSURE

Television display devices for use in the United States with screen size of 13 inches or greater are required to decode and display closed caption messages. This requirement specifies a common set of character-based display capabilities including the number of rows, columns, colors and a basic character-set that provides an on screen display or OSD capability. In addition such on screen display capability can facilitate the display of user controls, for example, channel selection, audio and video setting and maintenance adjustments. On screen messages are generated by a microcontroller from a stored character set and are inserted into the R, G and B video signals coupled for display.

On occasions, maintenance or diagnosis of problems within TV or video display device can necessitate the use of an oscilloscope or logic analyzer to determine the presence and qualitative characteristics of certain waveforms. For example, an infra red or IR remote signal originating from a hand-held remote-control unit is typically detected within a display device by circuitry sensitive to the particular characteristics such as, optical wavelength, modulation frequency, etc. of that signal. The detected, or often termed the envelope signal is coupled to other functional systems within the display device as a serial digital signal. These other systems typically decode signal and reconstruct the intended remote-control command which is then executed yielding the desired response. However, a remote control unit can generate an encoded control signal unknown to the display device, particularly, for example, when a third-party set-top box receives a detected-IR signal from the display device to which it is connected, decodes the signal and initiates appropriate action itself. In either arrangement, when the anticipated command is not executed, it can be useful to monitor the intermediate, or decoded signal to assess whether or not it represents the general signal pattern expected in response to a button-press on the remote control. In this way the problem can be isolated to points preceding or succeeding the signal monitoring point.

Furthermore, within a display device various functional-blocks communicate between themselves at periodic intervals via serial communication busses, and many of such functional blocks employ internal feedback signals as part of control loops. Clearly a simple, cost effective monitoring arrangement is required to indicate received control signal sequences or diagnose the general electronic well-being of the video display device.

SUMMARY OF THE INVENTION

To facilitate maintenance or diagnosis of a video display device and to obviate use of expensive and bulky test equipment, an inventive arrangement displays data within a display by use of an on screen message display capability. The method comprises the steps of accessing digital data within the display and displaying each bit of data as a character forming part of an on screen message display representation of the digital data.

In an exemplary IR remote signal, wherein the only states of interest are the absence or presence of modulated signal, an intermediate signal may be sampled by means of a digital input with each sample mapped to one of two possible display characters. Often the modulated envelope signal is present at a digital interface connection for purposes of normal decoding of the remote-control command. The generalized format of the received IR transmission can be visually presented, allowing the comparison of the displayed signal format against a known or expected format. Thus it is possible to verify that the display device has or has not received and detected the remote-control transmission, regardless of whether the display or third-party device, for example a set top box, successfully decoded and executed the appropriate response.

It should be noted that this inventive use of display characters is equally applicable to a variety of other digital signals existing within the display which can be represented for visual comparison and recognition.

In addition this inventive arrangement can provide a visual depiction of a variety of analog signals for generalized comparison and recognition. Samples of such signals may be obtained for example by analog-to-digital conversion yielding quantized values of two or more states which are mapped to two or more display characters to represent the quantized states.

DETAILED DESCRIPTION

Figure 1:
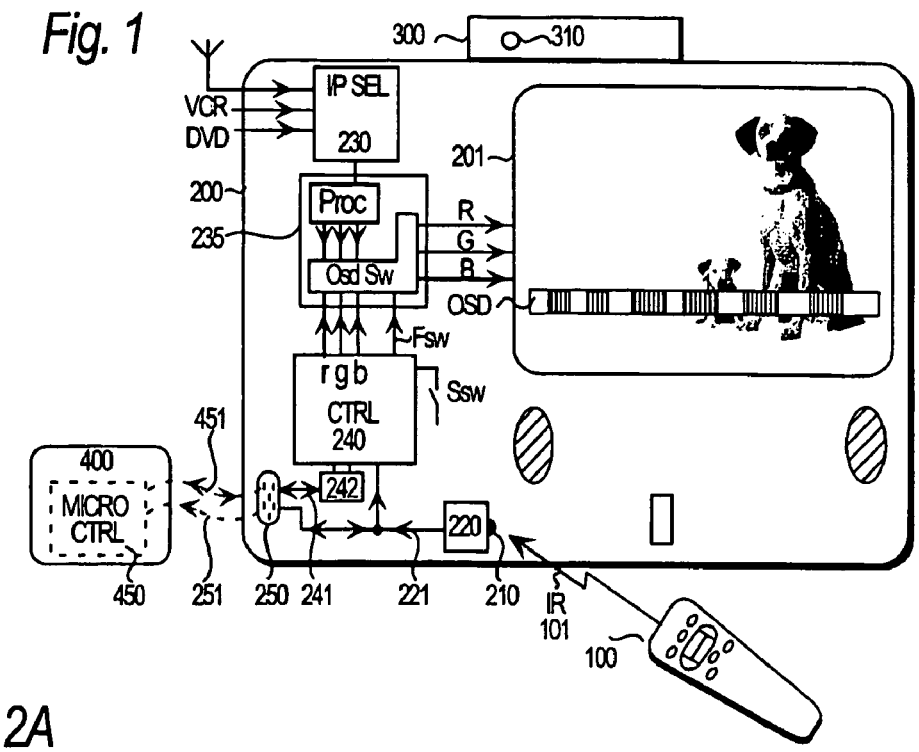
FIG. 1 depicts a video image display with an inventive on screen display arrangement.

FIG. 1 is a block diagram depicting a video display device 200 with on screen display capability. Exemplary display 200 includes an input signal source selector 230 which includes a tuning device capable of receiving RF modulated signals from sources such as cable, satellite or terrestrial broadcast. In addition source-selector 230 permits selection of base band input signals from, for example, VCR, DVD, video game or computer signal sources. A selected signal from selector 230 is coupled to a processing arrangement 235 which can provide multiple functions, including sync separation and deflection processing, audio demodulation and decoding of coded signal inputs to produce display drive signals, for example signals RGB, shown coupled to display screen 201. In addition, video processor 230 includes a circuit arrangement depicted by block OsdSw, which permits on screen display (OSD) message characters from controller 240 to be inserted into the selected video display signal. Message characters are generated from a stored set and are controllably inserted into the video display signal in response to control signal Fsw generated by controller 240. The display message characters can be switched into the display signal to replace the original signal or can be mixed to transparently overlay the background image. The arrangement and operation of on screen display character generation and insertion is well known and will not be described further.

In video display 200, an infra red sensor 210 receives control data transmitted on a modulated carrier, for example IR signal 101 radiated from remote control device 100. Sensor 210 is coupled to an infra red receiver 220 which amplifies the sensor signal and forms an output signal 221 which represents the envelope from IR signal 101. Clearly other methods of control communication are possible, for example, a radio frequency carrier can be employed to transmit control data from a remote location.

The remote control signal envelope, signal 221, is representative of data modulated on the exemplary IR carrier, where for example, an envelope pulse represents a logical 0 state and an envelope absence or low amplitude value is representative of a logical 1 state. Envelope signal 221 is coupled to micro controller 240 where it is sampled for data recognition, control decoding and control command assertion. Advantageously signal 221 is also coupled to connector 250 which facilitates external control of the display, for example, during manufacturing, alignment and set up. Connector 250, also known as a smart plug, allows use of a wired remote control unit. Connector 250 is connected to a bi-directional serial communication bus 241 which provides communication with micro controller 240 via interface circuit 242. In addition, a so called clone box can be coupled to connector 250 which, as will be explained later, allows display setup parameters to be copied and duplicated between multiple display devices.

In a first inventive arrangement, an IR remote signal 101 from a remote-control unit 100 generates a control representative envelope signal 221 that is advantageously processed by micro controller 240 and results in the selection of characters from an existing character-set as visual indicators of logical states represented by envelope signal 201, regardless of whether or not microcontroller 240 can decode and recognize the information encoded in signal 221. In this way data patterns in signal 221 can be viewed on screen by utilizing an existing on-screen message capability. This alternative use of the display OSD character-set also allows a visual representation or depiction of various signals present within the display thereby permitting diagnostic evaluation.

The use of characters from a character-set to represent logical states can be considered to provide a quasi-real-time oscillograph of the digital waveform. This inventive diagnostic display can be considered to operate in quasi real-time because of delay in updating the character-based display. However, this arrangement provides an inexpensive, first level trouble shooting aid, where the visual on screen depiction can provide a valuable diagnostic indicator. For example, remote control data is typically modulated on an infra-red signal which is received and demodulated forming an envelope signal representative of the digital command information encoded as a pulse pattern having pulses of various duration and pulse intervals. Thus a control signal format and protocol generated by particular type of remote control unit can be recognized by characteristic pulses and intervals when depicted on screen. In this way the proper operation of both the remote-control transmitter and the TV display and detector can be verified even if the received signal format or protocol fails to produce control data that is executable by the TV display.

Operation of the advantageous on screen data representative display is as follows. During normal display operation microcomputer 240 receives envelope signal 221 which is extracted from the IR remote control signal. Signal 221 is sampled by microcomputer 240 for data recognition, control command decoding and control assertion. However, microcomputer 240 is advantageously programmed and selectably controlled, for example, by service mode selector switch Ssw, or by an IR command concealed from the user, to ignore or obey any executable code represented by the sampled envelope 221. When the service mode is activated predetermined characters from the display character set are selected to represent logical states derived from envelope signal 221. Microcontroller 240 stores the sampled signal envelope and forms, from the stored digital samples, a string of characters representative of the stored digital signal values. For example, if the stored sample is a logical 1 a first predetermined character code is selected to represent the logical 1 state. Similarly if the stored sample is a logical 0 a second predetermined character code is selected to represent the logical 0 state. Thus remote control data is transformed into a visually representative string of characters for on screen display. The on screen data representation can be triggered or synchronized to locate specific control commands by additional manual programming of microcontroller 240 to identify specific digital words present in the control data stream. Such trigger words can be entered by hard wired switches such as switch Ssw, or by non-user, or service technician IR commands.

The inventive data sampling and representative display character string generation previously described can also be performed by a micro controller external to the display, for example as depicted by block 400 in FIG. 1. As described previously, communications port (250) is present on many TV and video display devices for use, for example, during manufacturing and set up or for commercial environments such as hotels, hospitals and schools, that require identical parameter setting or coordinated operation with a set-top box or similar device. The signals available on this port (250) include the IR remote-control envelope signal (221/251), and a data bus (241/451) which allows bi-directional serial communication with display microcomputer 240 via interface 242. Communication port (250) allows a set-top box to monitor and govern or control operation of the display and, in addition, port (250) permits the use of wired remote control units and hand-held test-devices. An example of such a test device is the Thomson Clone Pro which can access memory locations within display 200 to up-load or down-load non-volatile memory to permit the duplication of settings and control capability between a plurality of devices. Such display memory duplication is also known as memory cloning. Thus, as described previously, microcontroller (450) resident within device (400) can perform functions, similar to those described for controller 240, to facilitate the inventive sampling of remote control signal envelope 221/251 coupled from receiver (210). Furthermore, an entry key pad on exemplary test device 400 can readily facilitate entry of specific data trigger words, as described, to allow specific product codes to be verified or control commands to be evaluated. Microcontroller 450 constructs an ASCII encoded character-based representation of the logical state of samples stored from signal 251. The data representative character string is coupled to port 250 of display 200 as a serial data stream (451/241) and interfaced by block 242 for subsequent formatting and display by controller 240 as an on screen character display.

Figure 2A:
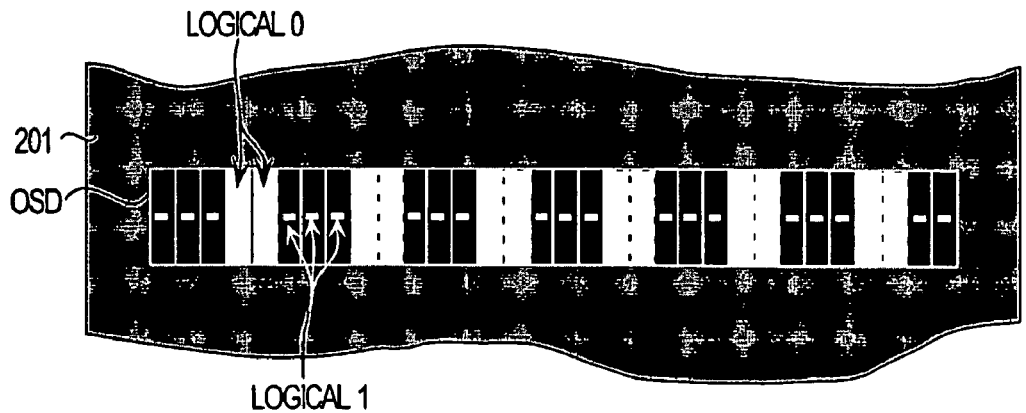
FIGS. 2A and 2B depict an array of on screen display characters generated in accordance with the inventive arrangement of FIG. 1.

This alternative on screen display (OSD) usage to visually depict logic states can have an exemplary form as a single row of 34 characters as shown in FIG. 2A. For example, periods of IR modulation can be represented a solid white or colored block, with the intervening periods, for example absent modulation being represented by a dash or an underscore character. Similarly, absent or intermittent data can for example, be represented by a star, exclamation mark or flashing character. Clearly, selection from the existing closed caption character set offers a minimized cost solution for on screen data representation. However, certain other onscreen characters, for example, question marks, arrow heads representing greater than and less than symbols, can be envisaged as providing useful depictions of signal conditions or occurrences.

Although the arrangement of FIG. 1 illustrates an inventive on screen representation of remote control code, this advantageous signal visualization method can clearly be applied to signals within the display using the resident display microcontroller and display character set. Furthermore, the video display device can be deemed to include a remote control unit since many display features or control adjustments are not accessible with hardware interfaces such as knobs and switches, but can only be manipulated via a remote control unit.

In a second inventive arrangement an exemplary display data bus can be monitored for normal or abnormal activity. In an $I^2C$ bus arrangement for example, a master device polls a succession of slaves devices which are expected to acknowledge the poll by pulling an SCL line low. By monitoring such polling and an acknowledgments, a normal bus and therefore normal system operation can be inferred and represented by a particular OSD presentation. For example, a solid bar formed by adjacent white or green blocks can be chosen to represent normal system operation. An absence of a slave device acknowledgment can be deduced to represent non-standard bus activity indicative of display malfunction which can be depicted for example, by a display of exclamation marks, question marks or alternating characters, OHOH, or a flashing colored bar. In a similar manner feedback signals from an exemplary control loop within a switch-mode power supply, tuner or phase-lock Loop can be monitored for normal or unexpected activity by the advantageous use of OSD message characters for visual representation.

The invention can be extended to any number of digital signals of interest and analog signals of limited resolution. However, in the forgoing exemplary uses, an additional benefit ensues from the evaluation of the external bi-directional serial interface at connector (250), where the output capability is utilized during sampling of the IR signal envelope with the input capability being exercised by the signal representative 34 ASCII character serial string returned to the display for on screen display. The basic inventive concept can be extended to any number of signals of interest. The simplest and possibly least-costly arrangements entail the choice and use of a few of the already-existing characters in the OSD to represent "high" and "low" states of digital signals. However, certain other onscreen characters, for example, arrow heads can be envisaged to provide on-screen depiction of signal transitions. If analog-to-digital (A/D) conversion is available, for example within the microcontroller, selected characters can represent simple digitization of analog signals. Furthermore additional processing can facilitate recognition of particular data patterns within a sample-series, such as polling acknowledgment on an $I^2C$ bus, or determination of time-variation between sample-series, where each is represented by further selected characters. More advanced display devices with graphics-based on screen display capability can provide greater flexibility in defining and facilitating OSD representation of signals and states.

The inventive use of on screen display capability to represent signal waveforms is readily applicable to display-devices other than television-receivers, capitalizing upon any inherent display capabilities of the device to provide representation of internal signals as a first level service function.

Figure 3:
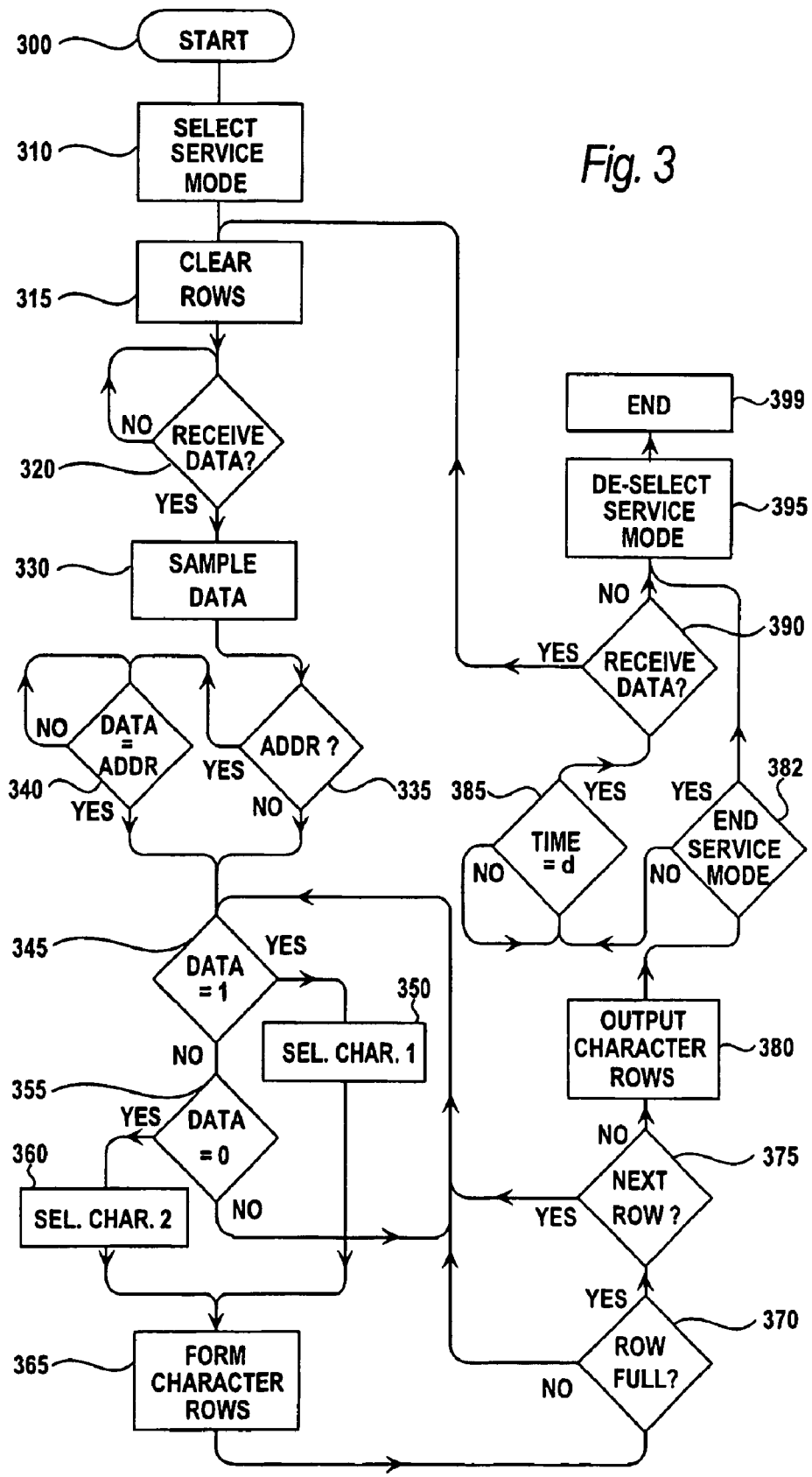
FIG. 3 shows an exemplary control sequence for the inventive arrangement of FIG. 1.

An exemplary control sequence is shown in FIG. 3 which receives data from, for example, envelope signal 221 or port 250 and selects specific characters to represent the logical states present in the data. The data presentation sequence begins at block 300 and at block 310 a service mode is selected which allows data signals to be represented by display characters. When remote control data is to be displayed the service mode may selectably permit or inhibit the execution of legitimate control commands. At block 315, a memory location used to assemble a row or rows of data representative characters is cleared prior to determining reception of control data at test 320.

If data is not received a NO results at test 320 and a loop is formed which waits for data resulting from a remote control button push or an internal housekeeping data event. When block 320 tests YES the received data is sampled and quantized at block 330.

Integral to the sampling process within block 330 is quantization of the signal into discrete states. A digital signal can be usefully quantized into, for example, two states with the resulting logical states "0" and "1" represented by one of two possible characters placed into the on screen display row at a column or horizontal location that corresponds to the occurrence of the bits in the received signal, and the time at which the sample was taken, as shown in FIG. 2A.

Figure 2B:
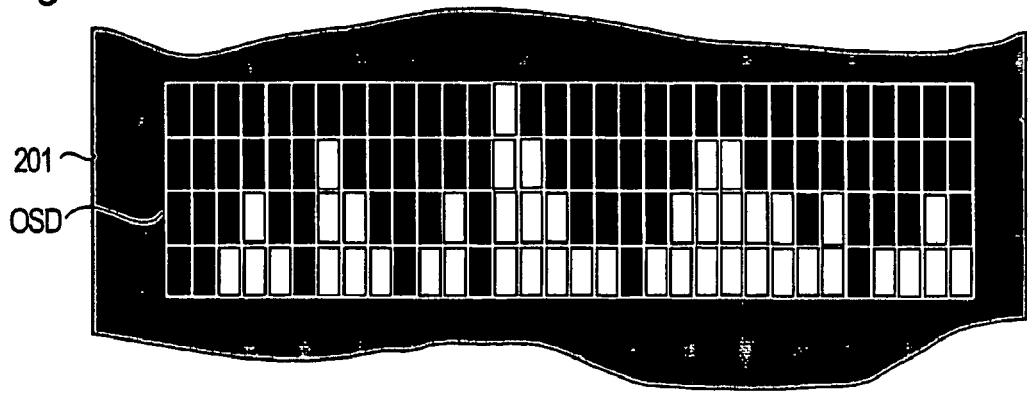

However, some signals (particularly analog signals) may have more than two discrete states of interest and may be quantized or digitized by one of any number of well known means. For example, the quantizing function of block 330 can be performed by microcontroller 240 or 450, and thus non-digital signals can be represented as digital values having multiple bits. Such digitized analog signals can be advantageously represented by use of closed caption characters arranged, for example, as depicted in FIG. 2B. FIG. 2B shows a display width of 34 characters having a maximum column height of four rows. The column height can for example be variably determined by the digital representation of the analog signal. For example, a digital value representing a least significant bit can be depicted by black block, with values of $2^1$, $2^2$, $2^3$ and $2^4$ being represented by for example white or yellow blocks arranged to form a column. Alternatively, such signals can be advantageously represented by choosing among a set of display characters, each of which represents a discrete state of the signal, placed one per sample on a single row of characters. The choice of character representation between the many variations and extrapolations possible is an implementation decision based upon usability of the resulting visual presentation.

The sampled or quantized remote control signal data is examined at step 335 to determine if a digital address word or bit pattern has been input for testing at step 340. If step 335 tests NO, the sampled data from step 330 is passed for assignment of bit representative OSD characters, as will be described. The presence of a particular digital address word or bit pattern is tested at step 340 and can, for example, identify the manufacturer of a targeted device, the type of device to be controlled, TV, VCR, set top box, personal video recorder etc., or a specific control command. If a NO results at test 340, a loop is formed which continues to monitor the samples taken at step 330 and awaits a match or equality between the samples and user determined data set, data word or bit pattern. In this way the display characters can be synchronized to a specific occurrence in the sampled signal. Upon detection of the address word or control bit pattern, the bit sequence is parsed at steps 345 to 360 to identify logical values, for example, 0 and 1 and to assign a predetermined character to be representative of the logical value of each bit.

As mentioned previously an analog signal can be represented by digital words. For example, if a 4 bit range of values is used for quantizing the signal then an arrangement similar to steps 345 to 360, but with more stages can identify a specific character or a specific character position in the closed caption display array. FIG. 2B shows an on screen display where digital values (representing the quasi-instantaneous analog signal amplitudes) are visually presented by columns of varying heights.

The sequence of bits from step 335, or bits selected responsive to address detection at step 340, are parsed at step 345 to identify the presence of a logical 1 value, with a YES causing the selection at step 350 of a first predetermined character to provide a visual on screen representation of a logical 1. If step 345 tests NO a second test is performed at step 355 which identifies the presence of a logical 0 and results in the selection at step 360 of a second predetermined character to be representative of a logical 0. However if step 355 tests NO a loop is formed returning to step 345 which waits for the appearance of data having logical values 0 and 1.

The selected predetermined characters codes from steps 350 and 360 are assembled in order of detection to form a row at step 365, with the row fullness, for example, 34 characters being tested at step 370. If the row is not full a loop is formed back to step 345 which is repeatedly traversed until the row is completed as indicated by YES at step 370. However although the maximum number of characters that can be displayed is 34, a lesser display number can be entered manually as the target value for test 370. The selection of a multiple row display is determined at step 375. An example of such a display is depicted in FIG. 2B which shows 4 rows each with 34 characters. Thus a YES at step 375 causes steps 345 through 375 to be repeatedly traversed until, for example, an array of 4 rows of 34 characters has been assembled and step 375 tests NO.

The competed single row or array of rows is output to the on screen display generator for display at step 380. A test is performed at step 382 to determine if the service condition with OSD character representation is to be terminated with a YES being coupled to step 395 which terminates the diagnostic display condition. If step 382 tests NO the character depiction of the sampled data is displayed for a predetermined period of time d, which is measured at step 385. Clearly the length of time for which the data bits are displayed partly contributes to the quasi-real time characteristic of this data display method. In an alternative view, this advantageous display arrangement may be considered to function somewhat like a storage oscilloscope where transient or intermittently occurring signals are periodically captured, for example at step 330, and displayed for time period d at step 385. Furthermore if time period d is arranged to represent the period of a cyclical timing function having a period of for example 0.5 or 1 second, then signals of a cyclical or periodic nature can be depicted by this on screen display method.

When step 385 tests YES the display period has ended and a further test is performed at step 390 to determine if further data has been received with a YES result causing the prior assembled row, or rows, of data to be cleared at step 315, in preparation for new data reception and depiction. If further data has not been received step 390 tests NO causing, at step 395, termination of the service mode and ending the on screen data display mode at step 399.

This inventive use of an existing on-screen message capability provides a visual representation of either analog or digital signals within the display and facilitates a simple, cost effective diagnostic evaluation for field service personnel.

What is claimed is:

1. A method for displaying remote control data corresponding to an activation of a button on a remote control, the remote control data being received by a video display having on screen message display capability, comprising the steps of:
   a) receiving the remote control data; and
   b) employing the on screen message display capability of the video display to display the remote control data as a character on the video display said employing step further comprising the step of selecting a first character set to represent a bit of the remote control data having a logical zero value.

2. The method of claim 1, further comprising the step of; selecting an operating mode for said video display.

3. The method of claim 2, wherein said operating mode selected by said selecting step is a service mode.

4. The method of claim 1, wherein said employing step further comprises the step of;
   selecting a second character from said character set to represent a bit of the remote control data having a logical one value.

5. The method of claim 4, wherein said employing step further comprises the step of;
   forming said first and second characters representative of each said bit as a row.

6. The method of claim 5, wherein said employing step further comprises the step of;
   coupling said row of said first and second characters for on screen message display.

7. A video display with on screen display capability for displaying a signal within a video display using a method, comprising the steps of:
   a) accessing an analog signal representative of received remote control data within said display;
   b) quantizing said analog signal to form digital words; and
   c) employing the on screen message display capability of the video display to display ones of said digital words as characters forming part of an on screen representation of said analog signal said employing step further comprising the step of selecting a predetermined character from an on screen message character set to represent a first digital value of said digital words.

8. The method of claim 7, wherein said employing step further comprises the step of;
   forming a column of said predetermined characters having a column height representative of a digital value of said digital words.

9. The method of claim 7, wherein said employing step further comprises the step of;
   selecting from a predetermined group of characters from an on screen message character set, a different character to represent respective values of each said digital word.

10. A method for the display of remote control data in a video display having on screen message display capability, comprising the steps of:
    a) selecting an operating mode for said video display;
    b) receiving a remote control command; and,
    c) employing the on screen message display capability of the video display to display the data from said remote control command, wherein said employing step further comprises the step of representing a logical zero data bit from said remote control command as a first character from a character set stored for display by said video display.

11. The method of claim 10, wherein said employing step further comprises the step of;
   e) representing a logical one data bit from said remote control command as a second character from a character set stored for display by said video display.

12. The method of claim 10, wherein said employing step further comprises the step of;
   f) selecting characters stored for display to represent said data from said remote control command.

13. The method of claim 12, wherein said employing step further comprises the step of;
   g) representing logical states of data from said remote control command with characters specific to each logical state.

14. A video display apparatus having an on screen message display and remote control capability, comprising:
   a remote control message receiver for receiving a remote control command and forming data therefrom;
   a controller receiving said data; and
   an on screen display generator coupled to said controller and generating characters for display responsive to said data formed from said remote control command, wherein said video display apparatus operates in a particular operating mode and said controller processes said data for coupling to said on screen display generator such that specific characters are generated in accordance with logical states existing in said data.

15. The video display of claim 14, wherein said particular operating mode is a service mode.

16. The video display of claim 14, wherein said characters are from a closed caption set.

* * * * *